(12) United States Patent
Hofbauer et al.

(10) Patent No.: US 6,175,141 B1
(45) Date of Patent: Jan. 16, 2001

(54) OPTO-ELECTRONIC SENSOR COMPONENT

(75) Inventors: Hermann Hofbauer, Trostberg; Bernd Kriegel, Berlin; Peter Speckbauer, Kirchweidach; Martin Ullrich, Ruhpolding; Ruport Dietl, Engelsberg, all of (DE)

(73) Assignees: Dr. Johanne Heidenhain GmbH, Traunreut; Silicon Sensor GmbH, Berlin, both of (DE)

( * ) Notice: Under 35 U.S.C. 154(b), the term of this patent shall be extended for 0 days.

(21) Appl. No.: 09/091,536

(22) PCT Filed: Dec. 20, 1996

(86) PCT No.: PCT/DE96/02478

§ 371 Date: Jun. 18, 1998

§ 102(e) Date: Jun. 18, 1998

(87) PCT Pub. No.: WO97/23897

PCT Pub. Date: Jul. 3, 1997

(30) Foreign Application Priority Data

Dec. 21, 1995  (DE) .............................................. 195 49 228

(51) Int. Cl.⁷ ..................... H01L 31/0224; H01L 31/068; H01L 31/0312
(52) U.S. Cl. .......................... 257/444; 257/437; 257/448; 257/461; 257/77
(58) Field of Search .................................. 257/443, 444, 257/448, 461, 226

(56) References Cited

U.S. PATENT DOCUMENTS

| 3,549,960 | 12/1970 | Wedlock | 317/235 |
|---|---|---|---|
| 3,903,427 | 9/1975 | Pack | 250/578 |
| 3,903,428 | 9/1975 | DeJong | 250/578 |
| 3,988,764 | 10/1976 | Cline et al. | 357/51 |
| 4,104,674 | * 8/1978 | Lorenze | 257/444 |
| 4,521,798 | * 6/1985 | Baker | 257/444 |
| 4,532,699 | * 8/1985 | Bourdillot | 257/443 |
| 4,720,738 | * 1/1988 | Simmons | 257/444 |
| 4,897,123 | 1/1990 | Mitsui | 136/256 |
| 4,956,687 | * 9/1990 | De Bruin et al. | 257/443 |
| 5,075,238 | 12/1991 | Solomon | 437/3 |
| 5,100,480 | 3/1992 | Hayafuji | 136/249 |
| 5,173,574 | 12/1992 | Kraus | 174/261 |
| 5,751,049 | * 5/1998 | Goodwin | 257/443 |

FOREIGN PATENT DOCUMENTS

| 4228274 | 3/1994 | (DE) . |
|---|---|---|
| 58-107788 | 6/1983 | (JP) . |
| 63-066964 | 3/1988 | (JP) . |

* cited by examiner

*Primary Examiner*—Gene M. Munson
(74) *Attorney, Agent, or Firm*—Christie, Parker & Hale, LLP

(57) ABSTRACT

The invention relates to an opto-electronic sensor component comprising the following: a first semiconducting layer of predetermined conductivity type and a second layer of different semiconductor or metal conductivity type; a transition region between the two layers; at least one surface region through which the electromagnetic radiation to be detected can pass into the transition region (radiation-side surface region); and an electrode for each layer to connect both layers to an electrical circuit. The electrodes of the two layers are mounted on a surface of the component opposite a radiation-side surface region. This simplifies connection of the sensor component to an electrical circuit mounted on a circuit board or the like.

19 Claims, 1 Drawing Sheet

OPTO-ELECTRONIC SENSOR COMPONENT

FIELD OF THE INVENTION

The invention relates to an opto-electronic sensor component.

BACKGROUND OF THE INVENTION

Opto-electronic sensor components are radiation receivers which convert electromagnetic radiation energy (photons) into electrical signals and are of great importance in the field of measuring technology. For example in position measuring systems such as length and angular measuring systems (of the incremental or absolute kind) several radiation receivers (more particularly photo elements) are mounted behind a grid structure.

Radiation receivers of this kind are as a rule designed as blocking layer photo detectors. They contain a PN, PIN, MS or MOS transition in which the conversion of electromagnetic radiation into an electrical signal is carried out by means of the photo barrier layer effect. In order to be able to measure and evaluate electrical signals the radiation receiver must be provided with electrical contacts and be connected to a suitable electrical circuit. This integration into an electrical circuit takes place frequently on a conductor plate. The radiation receivers are correspondingly preferably designed as SMD components (Surface Mounted Devices).

A soldering connector for electronic components is known from European Patent 0 464 232 B1. This can be used to integrate several photo elements into one electrical circuit. The photo elements are for example fixed with metallized backs, formed as contact faces, onto a conductor plate. The soldering connector has several soldering bridges and serves to connect the second contacts mounted on the front side of the photo elements to corresponding conductor panels of the conductor plate. The soldering bridges are provided with ideal break points and bending edges so that the production of the desired electrical circuit is made easier. Owing to the restricted space conditions on a conductor plate, however, the production of soldered connections has often proved difficult despite these measures.

A method for contacting opto-electronic components located on a carrier is also known from German Patent DE 42 28 274 A1. The contacts of the opto-electronic component which are arranged on the side of the component remote from the carrier are thereby connected to the connecting faces of the carrier located next to the component by means of conductor panels mounted on a plastics layer. When using this process, the space requirement for a component on a conductor plate is increased by the additional space required by the conductor panels including the plastics carrier.

From European Patent 0 452 588 A1 a solar cell is known. On this solar cell a semi-conducting layer of the n-type is mounted on a substrate. A part of the semi-conducting layer of the n-type and of the substrate is etched away for producing a cut in both layers. On the semi-conducting layer of the n-type, a semi-conducting layer of the p-type is arranged on which a further layer of the same conducting type and a anti-reflection film is mounted. In the cut and on the semi-conducting layer of the p-type an electrode is arranged, and by severing the substrate, a penetration of the electrode connected with the semi-conducting layer of the p-type is provided to the back of the component, where the electrode is electrically conducting connected.

A n-side electrode is provided by etching away the upper layers and the semi-conducting layer of the p-type and by etching a cut into the semi-conducting layer of the n-type and the rest of the substrate. The n-side electrode connects the semi-conducting layer of the n-type with the back side of the component and with a surface electrode provided thereon. Therefore, the known solar cell provides conducting connectors between the both semi-conducting layers by an electrically conducting layer arranged in the cuts.

From the U.S. Pat. No. 4,897,123 a solar cell is known with a semi-conducting substrate of the one conducting type and with a transition area of the other conducting type which extends through the substrate. A first semi-conducting layer is arranged on the front side of the substrate, and thereon a second semi-conducting layer of the opposite conducting type is arranged. Therefore, both layers form a PN-transition. The second semi-conducting layer is connected with the transition area extending from the front side to the back side of the solar cell.

At the front side of the solar cell, a contact electrode connected to one of the semi-conducting layers is arranged, and at the back side of the solar cell another contact electrode connected with the other semi-conducting layer is provided. Additionally another contact electrode is arranged at the back side of the solar cell which is connected by an electrically conducting clip with the electrode arranged at the front side of and connected with the one semi-conducting layer. While producing of the known solar cell, one of the producing steps provides a connection from the one semi-conducting layer to the back side of the component via the transition area. At that point, the component is divided and an electrical connection between the electrode arranged at the front side and the electrode arranged at the back side of the component is provided via the connecting element. A connection via a semi-conducting connecting element not corresponding to the transition area between the semi-conducting layers is not provided.

From the U.S. Pat. No. 3,903,428 a solar cell is known, whereby radial current taking paths are provided on a surface of a semi-conducting wafer. The back side of the semi-conducting wafer is connected with a metal layer. A bore is arranged in the semi-conducting wafer and is coated by an isolating layer. In the bore, a contact pin is placed which provides on its front side a conducting metal ring electrically connected with the current taking paths. On the back side the contact pin projects through the metal layer, so that an electrically conducting connection is provided between the current taking paths at the front side and a contact at the back side of the semi-conducting wafer.

From the U.S. Pat. No. 3,903,427 a solar cell is known having a wafer comprising some bores coated with isolating layers. A surface layer on the front side of the solar cell is connected with a metal layer at the back side via lines provided at the front side with current contact points forming metal contacts. The back side of the wafer is connected with a first conductor providing no electrical connection to the back side of the solar cell.

From the U.S. Pat. No. 3,549,960 a semi-conducting wafer is known having p- and n-contacts on a surface opposite the surface area on the radiation side. The contacts are formed as interlocking fingers.

SUMMARY OF THE INVENTION

The object of the invention is to provide for an opto-electronic sensor of the kind already mentioned a simple produceably connection between the one semi-conducting layer and the contact point on the surface of the component opposite the surface area of the radiation side by an electronic structure having no disturbance.

The invention is based on the knowledge that the connection of an opto-electronic sensor component to a circuit on a conductor plate is substantially simplified if the component and its electrodes are designed so that the contact points of the two electrodes can be mounted on one surface (back) of the component. A component of this kind can be attached with its back to a conductor plate having suitable contact faces without the need for additional wires or other connecting elements.

By the invention, a connection simply made by ion implantation, ion diffusion or thermo-migration is provided between the one semi-conducting layer and the contact point on the surface opposite to the surface area on the radiation side. The semi-conducting connection element provides the condition for a non-disturbed electronic structure of the connection between the semi-conducting layer and the contact point at the back side which can be raised, due to a further feature of the invention, by an additional semi-conducting area of the same conducting type around the semi-conducting connection element in the area of the contact point.

In difference to the known components, the connection between the one semi-conducting layer and the contact point arranged on the back side of the component is not made by a electrically conducting element but is made by a semi-conducting connection element integrated in the structure of the component. This simplifies the production because of making the connection during the production of the component and wafer respectively.

The opto-electronic component can consist for example of a first semi-conducting layer of the n-type on which a second semi-conducting layer of the p-type is mounted. Between the two layers is formed a space charging zone as the transition area (blocking layer) in which the incident radiation is absorbed by producing a photo current. However a PIN transition is also possible where a self-conducting centre layer is mounted as the blocking layer between the two semi-conducting layers of the first and second conducting type.

It is likewise possible to arrange a thin metal layer on a first semi-conducting layer so that a Schottky transition is formed. If in addition an oxide layer is mounted between the first semi-conducting layer and second metallic layer then a MOS transition is produced. Also these components are suitable for detecting electromagnetic radiation and to effect the solution according to the invention.

It should be pointed out that here the term transition or transitional area is to mean the area of an opto-electronic component in which by means of the photo effect optical energy can be converted into an electrical signal. The term is to be used as a supreme term for the terms blocking layer, space charging zone, p-n transition etc and always designates the overall area of the semi-conductor component in which absorbed radiation is converted into electrical signals. The areas adjoining the blocking layer are thereby to be included for example from which the charging carriers produced can spread during their service life into the electric field zones where the electrons are separated from the holes.

By a surface area on the radiation side is meant a surface of the core of the component consisting of the first and second layer as well as the transition layer through which surface the radiation to be detected can penetrate into the transition area and which is aligned when using the component as a sensor towards the radiation to be detected. It thus need not absolutely be a surface of the component in the wider sense (which also includes anti-reflection layers, structuring insulating layers and the like); e.g. an anti-reflection layer can still be mounted on the surface area on the radiation side.

So that the incident radiation reaches the transition area to the greatest possible extent at least one of the two layers (e.g. the second layer which is either semi-conductive or metal) is thinner than the penetration depth of the radiation to be detected in the corresponding material. The other layer is frequently made thicker and ensures the stability of the component. The component is then aligned in operation so that the thinner second layer faces the radiation to be detected. Embodiments are also possible where the radiation passes through the thicker first layer into the transition area.

As a result of the stabilizing thicker first layer the sensor components regularly consist substantially only of the two layers, between which the transition area is formed; this can still include an anti-reflection layer and thin insulating layer which serve for example for structuring a surface of the component. It is however possible to dispense with a substrate as a carrier for the two active layers forming the transition area.

The feature whereby the surface area on the radiation side is formed at least in part through the second layer does not absolutely mean that the component bonds with the second layer; it only concerns a surface of the core of the component consisting of the first and second layer as well as the transition area. Further completing layers, such as e.g. an anti-reflection layer, can still be arranged thereon.

The invention allows a particularly simple construction of the sensor component if the semi-conductive connecting element forms the single conductive connection between the second layer and its electrode and thereby runs through the component itself. A metal connecting element can however also be provided in addition to the semi-conducting connecting element.

Since when manufacturing the semi-conducting connecting element near the surface of the component provided with the electrodes (i.e. opposite the second layer) faults frequently form in the electronic structure, it is advantageous to surround the semi-conducting connecting element there with an additional semi-conducting area of the same conductive type. Such an additional semi-conducting area can be provided for example by ion implantation or diffusion and allows a satisfactory contacting of the second semi-conducting layer with its electrode mounted on the other side of the component.

The additional semi-conducting area preferably has such a size that it covers the entire marginal area of the connecting element which is liable to breakdown near the back surface of the component. Its expansion parallel to the extension direction of the connecting element amounts typically to about 0.6 $\mu$m.

In order to minimize the resistance of an assembly where the second layer is connected by a conducting connecting element to an electrode on the other side of the component several (parallel running) connecting elements can be provided in the component.

The passage is preferably formed cylindrical and the area surrounding same hollow cylindrical whereby the passage has a diameter of 10 $\mu$m to 150 $\mu$m. The thickness of the area enclosing the passage lies preferably between 3 $\mu$m and 10 $\mu$m. These passages can be made with an intensive laser beam and the doped areas surrounding same by diffusion.

In another advantageous variation at least one semi-conducting channel extends from the second layer to the surface of the component opposite the surface area on the radiation side and has the same conduction type as the second layer and allows a contacting of the second layer on the back of the component.

A semi-conducting channel with a diameter of the cross-sectional surface of about 5 µm to 150 µm, preferably of 30 µm to 80 µm, can then be produced for example by means of thermo-migration of doping substances into the component. Further explanations on thermo-migration will be found in the description of the embodiments of the invention shown in the drawings.

According to another embodiment of the invention where the surface area of the component on the radiation side is formed at least in part by a surface of the second layer with the surface of the component remote from the surface area on the radiation side an additional area is provided with the conduction type of the second layer. The areas of the second conduction type are connected together conductively by a metal connecting element more particularly an insulating clip in or on which the connecting element extends. The connecting electrode of the second layer is mounted on the additional area of the second conduction type.

This embodiment of the invention can also advantageously be combined with the variations already described where a semi-conducting connecting element runs from the surface area on the radiation side to the surface of the component provided with the contact elements.

It is particularly advantageous for the production of a conducting connection with a clip or the like if the second layer extends at least up to one of the edges of the surface of the component on the radiation side. To this end it is necessary to separate the transition area vertically when singling out the components from a wafer.

Furthermore it is possible that the first (semi-conducting) layer consists of a material with a band gap (e.g. silicon carbide) which is so great that the radiation to be detected can also penetrate through the surface of the component opposite the second layer into the transition area (blocking layer). An opto-electronic sensor component of this kind allows in addition to the front radiation (through the second layer) also an efficient back radiation (through the first layer).

An embodiment of the component according to the invention where the surface area on the radiation side is formed by a surface of the first (semi-conducting) layer has a recess in the first layer of the kind where the thickness of the material between the surface of the component on the radiation side and the blocking layer is less than the penetration depth of the radiation to be detected. In order to ensure with this embodiment the stability of the component it can be proposed that the recess in the first layer is filled with a material which is permeable to the radiation to be detected.

With this embodiment of the invention the contacts of the two layers are mounted on the side of the component along which the second layer extends.

The present invention may be used advantageously in components which have several independent transition areas (e.g. PN transitions) and thus several surface areas sensitive to radiation. It can thereby include both a one-piece semiconductor component with several transition areas (monolithic array) and also a hybrid array consisting of several components. With each transition region an electrode pair is associated, the contacts of which lie on one side of the component.

Furthermore the present invention can be used with particular advantage in components where the electrodes of the two layers forming the transition area are arranged on a surface of the component, which is formed or defined by one of the two layers. Here are included also those components where the layer provided with the electrodes still has a thin anti-reflective layer, a thin insulating layer for structuring the surface or the like but not those components where the layer provided with the electrodes forms an (insulating or semi-conducting) substrate supporting the entire assembly.

Finally it is advantageous if the contact points of the layers consist of a material which can be soldered and/or wire-bonded and/or stuck in conduction.

BRIEF DESCRIPTION OF THE DRAWINGS

Further advantages of the invention will become clear from the following explanation of embodiments with reference to the drawings in which.

DETAILED DESCRIPTION OF THE INVENTION

Figure 1:
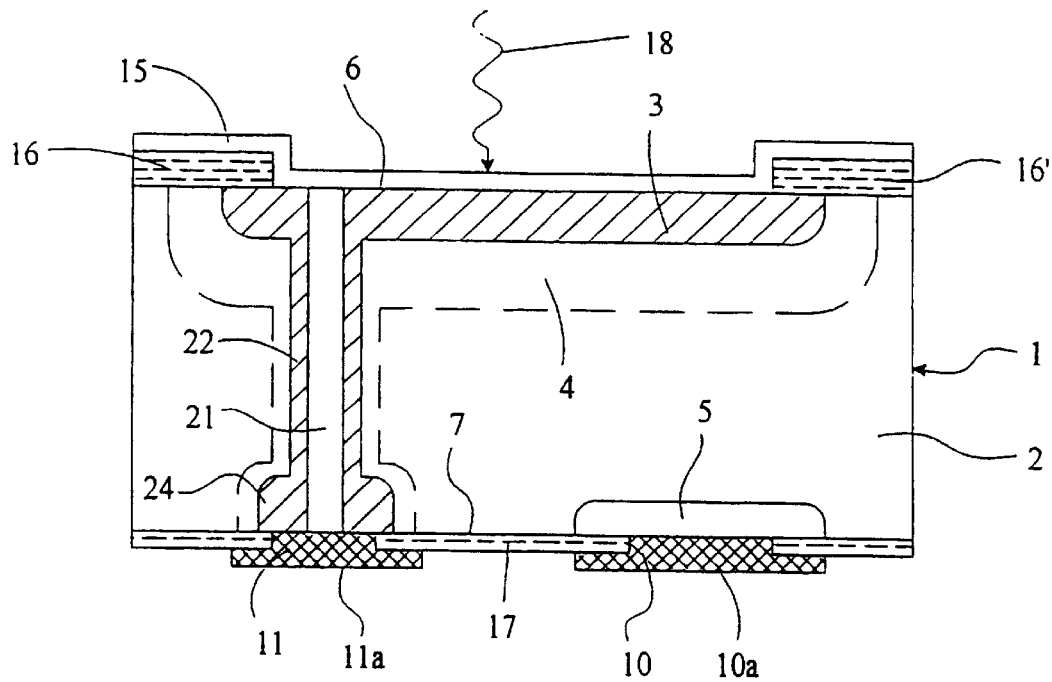
FIG. 1 shows an embodiment of the opto-electronic sensor component according to the invention with a hollow cylindrical semi-conducting connecting element from the front to the back of the component.

FIG. 1 shows a first embodiment of the opto-electronic sensor component according to the invention. The semi-conducting foundation body of the component 1 consists for example of silicon and comprises a wide n-conducting layer 2 (300 µm to 400 µm thick) on whose front surface extends a substantially thinner p-conducting layer 3 (about 0.55 µm thick). Between the two semi-conducting layers 2,3 is formed a space charging zone 4 (impoverished zone) which acts as a blocking layer.

The front side of the component 1 is provided with an anti-reflection layer 15 and is structured through insulating layers 16 and 16' which can consist for example of silicon dioxide. Between the two insulating layers 16,16' extends the surface area 6 on the radiation side which is formed by a surface of the p-conducting layer 3.

Electromagnetic radiation 18 striking the surface area 6 passes through the p-conducting layer 3 into the space charging zone 4 and is there absorbed for the most part. Electron hole pairs thereby form in the space charging zone 4. The space charging field separates these carrier pairs; electrons flow to the n-side, holes to the p-side. In order to be able to measure this photo current, which is a measure of the incident radiation capacity, the component 1 must be integrated into a suitable electrical circuit. Often an electrical circuit of this kind comprises several photo elements and further semi-conducting components which are mounted together on a conductor plate.

To connect the component 1 to such an electrical circuit, electrodes 10 and 11 with surface contact points 10a and 11a of soldering material are provided on the back surface 7 of the component which is structured through insulating layers 17. The back surface 7 is thereby formed by a surface of the n-conducting layer 2 itself.

The connecting electrode 10 of the n-conducting layer 2 is mounted on a low-ohm heavily doped area 5 of the semi-conducting layer 2 in order to minimize the contact resistance.

In order to be able to arrange the connecting electrode 11 of the p-conducting layer 3 likewise on the back surface 7 of the component 1, a cylindrical passage 21 with a diameter of approximately 100 μm extends from the radiation-side surface area 6 of the component 1 up to its back. The passage 21 is enclosed over its entire length completely by a hollow cylindrical p-conducting area 22 with a thickness of 3 μm to 10 μm. The connecting electrode 11 of the p-conducting layer 3 is mounted at the rear side end of the passage 21, next to the electrode 10 of the n-conducting layer 2.

The rear side end of the passage 21 is furthermore enclosed by an additional p-conducting area 24 which can be produced for example by ion implantation or diffusion and which allows a satisfactory contacting of the p-conducting layer 3 over the hollow cylindrical area 22 and the electrode 11. The expansion of the additional p-conducting area 24 is selected so that it encloses the section of the hollow cylindrical area 22 near the surface so that the faults appearing in the electronic structure during production of the hollow cylindrical area 22 near the surface are eliminated as far as possible. The thickness of the additional p-conducting area (expansion parallel to the extension direction of the passage 21) is in the order of 0.6 μm.

The passage 21 itself can be produced by means of an intensive laser beam. As a result of this passage 21 it is possible without any problem to form the p-conducting area 22 of the component 1 so that it extends through the 300 μm to 400 μm thick n-conducting layer 2 up to the back of the component 1. Without the passage 21 the distance between the p-conducting layer 3 and the rear side 7 of the component 1 would be too great to be bridged by the conventional diffusion process; typically it takes several hours to let doping substances spread about 10 μm deep into a semi-conducting layer by means of diffusion. In the present case, a gas containing the suitable doping substances is introduced into the passage 21 so that the doping substances penetrate into the wall of the passage 21 and form the hollow-cylindrical p-doped area 22. The additional p-conducting area 24 is preferably provided after preparing the hollow cylindrical area 22.

In order with the present embodiment of the invention to minimize the resistance of the anode, several hollow cylindrical p-conducting areas 22 can be extended from the p-conducting layer 3 to the back 7 of the component 1 and can be connected there to a contact point.

As a result of the electrodes 10 and 11 of the n-conducting layer 2 and p-conducting layer 3 respectively lying next to each other on the back surface 7 of the component 1, the component 1 can be attached very easily to a conductor plate and thereby integrated into an electrical circuit. To this end only the electrodes 10 and 11 need be set with their contact points 10a and 11a on contact faces of the conductor plate provided therefore and can be fixed by soldering or ultra-sound welding. Additional connecting elements, such as e.g. soldered bridges between the electrodes of the component 1 and the conductor plate are not required.

Figure 2:
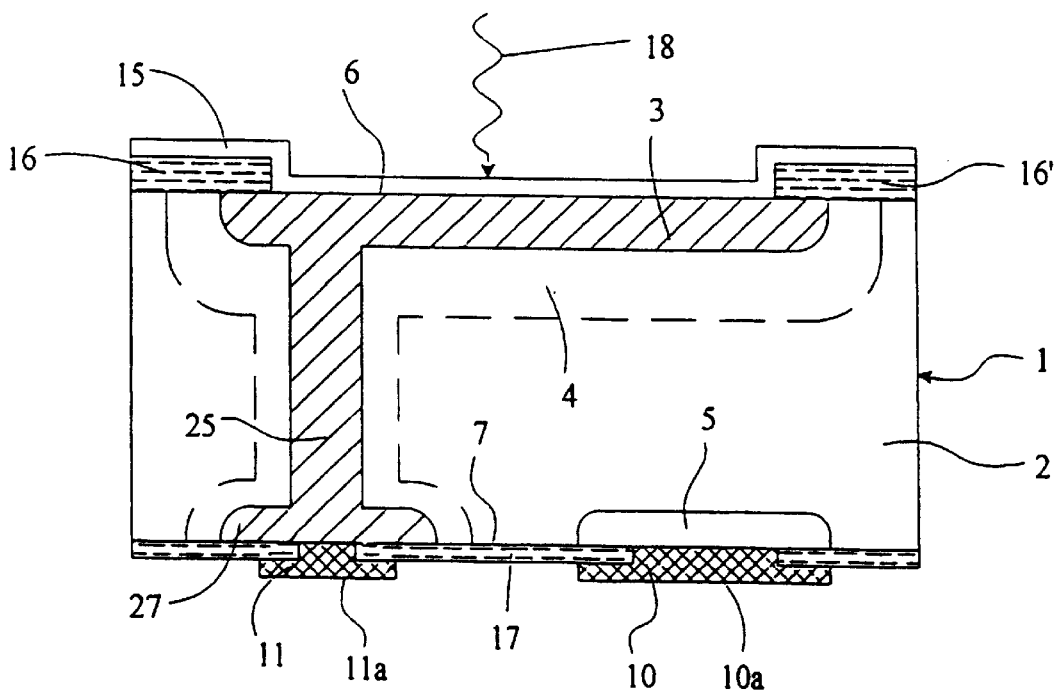
FIG. 2 shows an embodiment with a cylindrical semi-conducting connecting element from the front to the back of the component.

A second embodiment of the invention is shown in FIG. 2. It differs from the embodiment shown in FIG. 1 only with regard to the design of the connection between the p-conducting layer 3 and that with the electrodes 10, 11 of the back surface 7 of the component 1.

According to the embodiment in FIG. 2 a cylindrical semi-conducting channel 25 of the p-type extends between the p-conducting layer 3 and the back surface 7 of the component 1. The p-conducting channel 25 preferably has a diameter of 30 μm to 100 μm and can be produced by means of thermo-migration.

The principle of thermo-migration is based on the fact that the solubility of metal doping substances in semi-conducting materials, such as e.g. silicon is temperature-dependent and increases with rising temperature. If between two opposite surfaces of a sufficiently heated semi-conductor component a temperature gradient is produced and a suitable metal doping substance (e.g. aluminum for p-doping of n-conducting areas) is applied to the cooler surface of the component then the metal doping substance migrates to the opposite warmer surface of the semi-conductor component. The shape of such channels can be accurately set through corresponding structuring of the cooler surface on which the doping substance is applied e.g. by means of oxide layers.

Details on the values of the pressure, temperature and other parameters at which the thermo-migration proceeds in optimum manner can be drawn from the relevant literature, for example U.S. Pat. No. 3,988,764.

As in the embodiment of FIG. 1 also here an additional p-conducting area 27 is provided at the end of the semi-conducting channel 25 where the electrode 11 is mounted, this area enclosing the channel 25 and having a thickness (in the longitudinal extension direction of the channel 25) of 0.6 μm.

Additionally to the connection channel 21, 22 and 25 respectively the connecting electrode 11 is connected conductively with the semi-conducting layer 3 through a clip of synthetic resin in which extends a metal connecting element (e.g. a copper panel).

If the sensor component 1 is made of a semi-conducting material with a sufficiently large band gap, e.g. of silicon carbide with a band gap of 2.2 eV to 3.3 eV, depending on poly type then infrared radiation and a part of the visible light can also penetrate from the back surface 7 through the n-conducting layer 2 into the blocking layer 4. Then owing to the large band gap the n-conducting layer 2 acts in this case as a window for the said electromagnetic radiation. With such a design of the structural element 1 a sensor is formed in whose blocking layer 4 the light can penetrate to produce a photo current both from the front as well as from the back.

Depending on the technical data of the associated electrical circuit (space requirements, function, interaction with other components etc) the component 1 can then be provided selectively either on the front side or on the reverse side with the necessary connection electrodes. The surface of the component provided with the electrodes is set on the conductor plate and the opposite surface is aligned towards the radiation source.

To sum up the embodiments explained above show that the opto-electronic sensor component according to the invention can be designed variably and can be adapted to different technical requirements. A simple connection of the component to a conductor plate or the like is thereby possible through the common arrangement of the two electrodes side by side on the reverse side.

What is claimed is:

1. Opto-electronic sensor component having a radiation side, the component comprising:

a first semi-conducting layer with a preset conduction type;

a second semi-conducting layer of a different conduction type than the first semi-conducting layer;

at least one transition area between the first and second semi-conducting layers;

at least one first surface on the radiation side through which electromagnetic radiation to be detected can penetrate into the at least one transition area;

two electrodes, each with a contact point, mounted on a second surface of the component, which is opposite the at least one first surface on the radiation side, for connecting the two semi-conducting layers to an electric circuits, wherein the two electrodes are spaced from the first surface;

at least one connecting element for connecting one of the contact points with the second semi-conducting layer, wherein the at least one connecting element is of the same conduction type as the second semi-conducting layer, and wherein the semi-conducting connecting element, being an extension of the second semi-conducting layer, forms a single conducting connection between the second semi-conducting layer and a respective one of the electrodes and is in direct contact with the respective one of the electrodes.

2. The component according to claim 1 wherein the conduction type of the first semi-conducting layer is a n-type and the conduction type of the second semi-conducting layer and the connecting element is a p-type.

3. The component according to claim 1 wherein the at least one connecting element is enclosed at an end opposite the at least one first surface on the radiation side by an additional semi-conducting area of the same conduction type as the at least one connecting element.

4. The component according to claim 1 wherein the at least one connecting element comprises a plurality of conducting connecting elements extending from the second semi-conducting layer to the second surface of the component.

5. The component according to claim 1 wherein the at least one connecting element comprises:

at least one passage extending from the second semi-conducting layer to the second surface of the component; and an area enclosing the at least one passage, wherein the area enclosing the at least one passage is of the same conduction type as the second semi-conducting layer.

6. The component according to claim 5 wherein the at least one passage is formed cylindrical and has a diameter of about 10 $\mu$m to about 150 $\mu$m, and wherein the area enclosing the at least one passage is a hollow cylindrical area of the same conduction type of the second semi-conducting layer.

7. The component according to claim 1 wherein the at least one connecting element comprises:

at least one semi-conducting channel extending from the second semi-conducting layer to the second surface of the component, having the same conduction type as the second semi-conducting layer.

8. The component according to claim 7 wherein the at least one semi-conducting channel is formed as a cylindrical channel with a diameter of about 10 $\mu$m to about 150 $\mu$m.

9. The component according to claim 8 wherein the at least one semi-conducting channel has a diameter of about 30 $\mu$m to about 80 $\mu$m.

10. The component according to claim 1 wherein the component comprises a pair of side edges, and wherein the second semi-conducting layer extends at least up to one of the pair of side edges of the at least one first surface on the radiation side.

11. The component according to claim 1 wherein a thickness of the second semi-conducting layer is less than a penetration depth of the radiation to be detected, and wherein the at least one first surface on the radiation side is formed at least in part by the second semi-conducting layer.

12. The component according to claim 1 wherein the first semi-conducting layer comprises a material with a band gap which is large enough that the radiation which is to be detected passes through the second surface of the component into the at least one transition area.

13. The component according to claim 1 wherein the at least one transition area comprises at least two independent transition regions, wherein each of the at least two independent transition regions are associated with a radiation side surface region, and wherein positions of the two electrodes are arranged along a plane.

14. The component according to claim 13 wherein a regular array of transition regions is provided.

15. The component according to claim 1 wherein the electrodes are mounted on a surface of the component which is defined by one of the first semi-conducting layers and the second semi-conducting layer.

16. The component according to claim 15 wherein each of the contact points comprises a soldering material.

17. The component according to claim 16 wherein each of the contact points comprises a material which is conductively stuck and with which a galvanic connection is made with a component carrier by means of an electrically conducting adhesive.

18. The component according to claim 15 wherein each of the contact points comprises a material which is wire bonded.

19. The component according to claims 15 wherein each of the contact points comprises a material which is soldered, wire bonded and conductively stuck.

* * * * *